US009507255B2

(12) United States Patent
Kim et al.

(10) Patent No.: US 9,507,255 B2
(45) Date of Patent: Nov. 29, 2016

(54) METHODS OF MANUFACTURING INTEGRATED CIRCUIT DEVICES BY USING PHOTOMASK CLEANING COMPOSITIONS

(71) Applicant: Samsung Electronics Co., Ltd., Suwon-si, Gyeonggi-do (KR)

(72) Inventors: Ho-young Kim, Seoul (KR); Dong-min Kang, Seoul (KR); Sung-bae Kim, Seongnam-si (KR); Hoon Han, Anyang-si (KR); Hong-kwon Youn, Suwon-si (KR); Hyo-sun Lee, Hwaseong-si (KR); Young-taek Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/750,651

(22) Filed: Jun. 25, 2015

(65) Prior Publication Data

US 2016/0116836 A1 Apr. 28, 2016

(30) Foreign Application Priority Data

Oct. 27, 2014 (KR) .................. 10-2014-0146434

(51) Int. Cl.
*C23G 1/02* (2006.01)
*G03F 1/82* (2012.01)
*C11D 11/00* (2006.01)
*C11D 7/26* (2006.01)
*C11D 7/34* (2006.01)
*B08B 3/00* (2006.01)
*B08B 3/04* (2006.01)

(52) U.S. Cl.
CPC . *G03F 1/82* (2013.01); *B08B 3/00* (2013.01); *B08B 3/04* (2013.01); *C11D 7/26* (2013.01); *C11D 7/34* (2013.01); *C11D 11/0047* (2013.01)

(58) Field of Classification Search
CPC ............. G03F 1/82; C11D 7/26; C11D 7/34; C11D 11/0047; B08B 3/00; B08B 3/04
See application file for complete search history.

(56) References Cited

U.S. PATENT DOCUMENTS

| 4,670,365 | A | * | 6/1987 | Yoshihara | ................. G03F 1/54 |
| | | | | | 427/530 |
| 5,114,494 | A | * | 5/1992 | Remec | .................... B08B 3/123 |
| | | | | | 134/1 |
| 6,071,376 | A | * | 6/2000 | Nagamura | ................. G03F 1/82 |
| | | | | | 134/1.1 |
| 6,841,526 | B2 | | 1/2005 | Lee et al. | |
| 7,294,518 | B2 | | 11/2007 | Park et al. | |
| 7,462,248 | B2 | * | 12/2008 | Chiu | ......................... G03F 1/82 |
| | | | | | 134/2 |
| 7,763,399 | B2 | * | 7/2010 | Sengupta | ............... B82Y 10/00 |
| | | | | | 134/1 |
| 8,252,488 | B2 | * | 8/2012 | Shiota | .................... B82Y 10/00 |
| | | | | | 134/1 |

(Continued)

FOREIGN PATENT DOCUMENTS

| JP | 411167195 A | * | 6/1999 |
| JP | 2008-047842 | | 2/2008 |

(Continued)

OTHER PUBLICATIONS

Eco Services, Material Safety Data Sheet, Jan. 20, 2015, Sulfuric Acid 98%, p. 1.*

*Primary Examiner* — Bibi Carrillo
(74) *Attorney, Agent, or Firm* — Myers Bigel, P.A.

(57) ABSTRACT

In a method of manufacturing an integrated circuit (IC) device, a photomask is wet-processed using a cleaning composition comprising an organic acid, an oxidizing agent, and deionized water (DIW).

10 Claims, 13 Drawing Sheets

(56) References Cited

U.S. PATENT DOCUMENTS

| | | | |
|---|---|---|---|
| 8,324,143 B2 * | 12/2012 | Suzuki | C11D 1/008 |
| | | | 134/1.3 |
| 8,333,843 B2 | 12/2012 | Mei et al. | |
| 8,759,220 B1 * | 6/2014 | Ogihara | G03F 7/0752 |
| | | | 257/E21.159 |
| 2006/0137717 A1 * | 6/2006 | Lee | G03F 1/82 |
| | | | 134/19 |
| 2008/0045016 A1 | 2/2008 | Andou et al. | |
| 2009/0001339 A1 | 1/2009 | Lee et al. | |
| 2009/0093118 A1 | 4/2009 | Uotani et al. | |
| 2009/0191471 A1 * | 7/2009 | Lee | C11D 3/3947 |
| | | | 430/5 |
| 2010/0163788 A1 * | 7/2010 | Visintin | C11D 1/62 |
| | | | 252/79.3 |
| 2011/0146727 A1 * | 6/2011 | Kalyankar | B08B 3/10 |
| | | | 134/28 |
| 2012/0211024 A1 * | 8/2012 | Dietze | B08B 3/10 |
| | | | 134/1.3 |
| 2013/0123411 A1 | 5/2013 | Quillen et al. | |
| 2015/0037712 A1 * | 2/2015 | Shih | G03F 1/22 |
| | | | 430/5 |
| 2015/0144160 A1 * | 5/2015 | Henry | C11D 7/04 |
| | | | 134/27 |

FOREIGN PATENT DOCUMENTS

| | | |
|---|---|---|
| KR | 1020060005790 A | 1/2006 |
| KR | 1020060102244 A | 9/2006 |
| KR | 1020070112273 A | 11/2007 |
| KR | 1020090002503 A | 1/2009 |
| KR | 102011003 4196 A | 4/2011 |
| KR | 101092076 B1 | 12/2011 |
| KR | 1020120036604 | 4/2012 |
| KR | 1020120111532 | 10/2012 |

* cited by examiner

METHODS OF MANUFACTURING INTEGRATED CIRCUIT DEVICES BY USING PHOTOMASK CLEANING COMPOSITIONS

CROSS-REFERENCE TO RELATED APPLICATIONS

This application claims the benefit of and priority under 35 U.S.C. §119 to Korean Patent Application No. 10-2014-0146434, filed on Oct. 27, 2014, the disclosure of which is incorporated herein by reference in its entirety.

FIELD

The present inventive concept relates to a cleaning composition and a method of manufacturing an integrated circuit device by using the cleaning composition, and more particularly, to a cleaning composition for removing a contaminant generated during photolithography using a photomask, and a method of manufacturing an integrated circuit device by using the cleaning composition.

BACKGROUND

During the manufacture of an integrated circuit device, a lithography process is used to form a circuit pattern on a wafer. In the lithography process, a photomask is used to transfer a desired pattern onto a substrate. Recently, as the design rule of semiconductor devices has reduced, the wavelength of light that is used during an exposure process tends to decrease. Accordingly, extreme ultraviolet (EUV) light having a short wavelength is used during an exposure process. During EUV lithography, when an EUV photomask that is not protected from pellicles is used, the EUV photomask may be polluted by foreign materials such as a carbon-containing material or particles, and thus, the polluted EUV photomask typically requires cleaning. Moreover, as a cleaning process for removing a contaminant on a photomask is repeated at regular intervals, the structure of an EUV photomask may be damaged, or a critical dimension (CD) of patterns included in the EUV photomask may change undesirably.

SUMMARY

The present inventive concept provides a method of manufacturing an integrated circuit (IC) device by using a photomask cleaning composition, by which a contaminant, such as carbon residue and particles, may be removed when a photomask contaminated during lithography is cleaned, and, even when a cleaning process for removing the contaminant on the photomask is repeated at regular intervals, the structure of the photomask may be prevented from being damaged by a cleaning material that is used during the cleaning. Additionally, in some aspects, a critical dimension (CD) of patterns included in the photomask may be prevented from changing undesirably.

According to an aspect of the present inventive concept, there is provided a method of manufacturing an integrated circuit (IC) device, in which a photomask is wet processed by using a cleaning composition including organic acid, an oxidizing agent, and deionized water (DIW).

The organic acid contained in the cleaning composition may be about 75 to about 99 wt %, the oxidizing agent contained therein may be about 0.1 to about 10 wt %, and the DIW contained therein may be about 0.1 to about 20 wt %, based on the total weight of the mixture.

A pH of the cleaning composition may be 5 or less.
The organic acid may include sulfonic acid.
The acid may include a compound represented by the following formula:

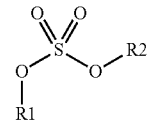

where R1 and R2 are each independently a hydrogen atom, a C1-C10 alkyl group, or a C6-C20 aryl group, and at least one of R1 and R2 is a C1-C10 alkyl group or a C6-C20 aryl group.

The acid may be formed of alkyl sulfonic acid, aryl sulfonic acid, taurine, perfluorooctane sulfonate (PFOS), tetrafluoroethylene-perfluoro-3,6-dioxa-4-methyl-7-octene-sulfonic acid, ethanesulfonyl fluoride, tetrafluoroethylene, trifluoromethanesulfonic acid, sulfamic acid, oxalic acid, sodium dodecylbenzene sulfonate, or mixtures thereof.

The oxidizing agent may be formed of chlorine dioxide, phosphoric acid, nitric acid, hydrochloric acid, hydrogen peroxide, alkyl peroxide, aryl peroxide, ammonium persulfate (APS), ammonium perchlorate (APC), or mixtures thereof.

The oxidizing agent may include a compound represented by the following formula:

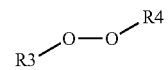

where R3 and R4 are each independently a hydrogen atom, a C1-C10 alkyl group, or a C6-C20 aryl group.

The wet-processing of the photomask may include putting the photomask in contact with the cleaning composition that is kept at a temperature in a range of about 20 to about 80° C.

Before the wet-processing of the photomask, the method may further include preparing a photomask blank, the photomask blank including a substrate, a multiple reflection layer formed on the substrate, a capping layer formed on the multiple reflection layer and including a metal, and a light absorption layer formed on the capping layer and including a metal; forming a photoresist pattern on the light absorption layer; and forming a photomask including a light absorption layer pattern by etching a portion of the light absorption layer by using the photoresist pattern as an etch mask. The wet-processing of the photomask may include stripping the photoresist pattern by using the cleaning composition.

According to another aspect of the inventive concept, there is provided a method of manufacturing an integrated circuit (IC) device. In this method, a photoresist layer formed on a wafer is exposed to light that is reflected by a photomask, and the photomask is cleaned by using a cleaning composition.

Organic acid contained in the cleaning composition may be about 75 to about 99 wt %, an oxidizing agent contained therein may be about 0.1 to about 10 wt %, and deionized water (DIW) contained therein may be about 0.1 to about 20 wt %.

The organic acid may include at least one selected from the group consisting of a C1-C10 alkyl group and a C6-C20 aryl group.

The organic acid may include 99.9% percent pure methane sulfonic acid (MSA).

The cleaning of the photomask may include dipping the photomask in the cleaning composition that is kept at a temperature in a range of about 20 to about 80° C.

The cleaning composition may include methane sulfonic acid (MSA) of about 75 to about 99 wt %, hydrogen peroxide of about 0.1 to about 10 wt %, and deionized water (DIW) of about 0.1 to about 20 wt %.

According to another aspect of the inventive concept, there is provided a method of manufacturing an integrated circuit (IC) device. In the method, a photomask blank is prepared, the photomask blank including a substrate, a multiple reflection layer formed on the substrate, a capping layer formed on the multiple reflection layer and including a metal, and a light absorption layer formed on the capping layer and including a metal. A photoresist pattern is formed on the light absorption layer. A reflective photomask including a light absorption layer pattern is formed, and the light absorption layer pattern is formed by etching a portion of the light absorption layer by using the photoresist pattern as an etch mask. The photoresist pattern remaining on the reflective photomask is removed by using a cleaning composition. The cleaning composition may include sulfonic acid, the sulfonic acid including at least one selected from the group consisting of a C1-C10 alkyl group and a C6-C20 aryl group; hydrogen peroxide; and deionized water (DIW).

The sulfonic acid contained in the cleaning composition may be about 75 to about 99 wt %, the hydrogen peroxide contained therein may be about 0.1 to about 10 wt %, and the DIW contained therein may be about 0.1 to about 20 wt %. The sulfonic acid may be 99.9% pure methane sulfonic acid (MSA).

The method may further include exposing a photoresist layer on a wafer to extreme ultraviolet (EUV) light reflected by the reflective photomask; and cleaning the reflective photomask to which the EUV has been radiated, by using the cleaning composition.

The cleaning of the reflective photomask by using the cleaning composition may include dipping the reflective photomask in the cleaning composition that is kept at a temperature in a range of about 20 to about 80° C. The cleaning composition may have an acidic pH. The pH may be 5 or less. The organic acid included in the cleaning composition may be at least 99.5% pure MSA.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION

Figure 1:
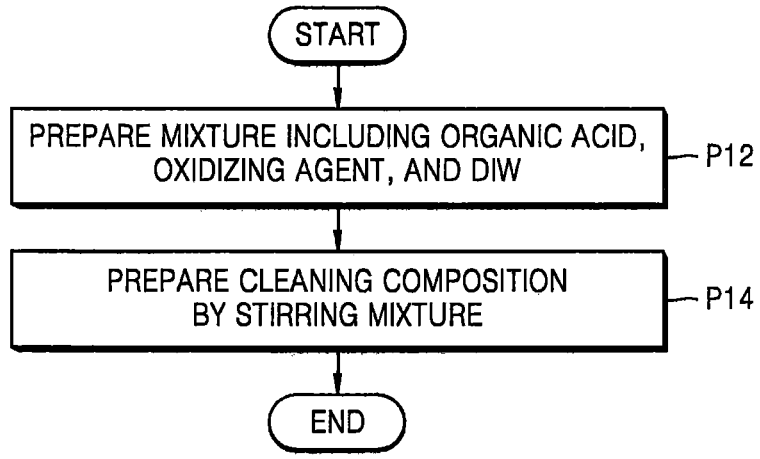
FIG. 1 is a flowchart of a method of preparing a cleaning composition, according to an embodiment of the inventive concept.

Hereinafter, the present inventive concept will be described more fully with reference to the accompanying drawings, in which exemplary embodiments of the present inventive concept are shown. Like reference numerals in the drawings denote like elements, and thus their description will be omitted.

The present inventive concept may, however, be embodied in many different forms and should not be construed as being limited to the embodiments set forth herein; rather, these embodiments are provided so that this disclosure will be thorough and complete, and will fully convey the present inventive concept to one of ordinary skill in the art.

It will be understood that, although the terms 'first', 'second', 'third', etc., may be used herein to describe various elements, regions, layers, sections, and/or components, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept. For example, a first component discussed below could be termed a second component, and similarly, a second component may be termed a first component without departing from the teachings of this disclosure.

As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "on," another element, it can be directly coupled, connected, or on, the other element, or intervening elements may also be present. In contrast, when an element is referred to as being "directly coupled," "directly connected," or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The present inventive concept is not limited to the described order of the operations. For example, operations consecutively described herein may be simultaneously performed in practice, or may be executed in the opposite order to the described order.

As such, variations from the shapes of the illustrations as a result, for example, of manufacturing techniques and/or tolerances, are to be expected. Thus, embodiments of the present inventive concept should not be construed as being limited to the particular shapes of regions illustrated herein but are to include deviations in shapes that result, for example, from manufacturing.

FIG. 1 is a flowchart of a method of preparing a cleaning composition, according to an embodiment of the present inventive concept.

Referring to FIG. 1, in operation P12, a mixture including an organic acid, an oxidizing agent, and deionized water (DIW) is prepared.

In some embodiments, the organic acid may include sulfonic acid. The sulfonic acid may include at least one selected from the group consisting of a C1-C10 alkyl group and a C6-C20 aryl group. For example, the sulfonic acid may be 99.9% percent pure methane sulfonic acid (MSA).

In other embodiments, the acid may include a compound represented by Formula 1.

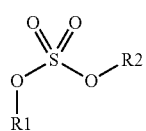

[Formula 1]

where R1 and R2 are each independently a hydrogen atom, a C1-C10 alkyl group, or a C6-C20 aryl group, and at least one of R1 and R2 is a C1-C10 alkyl group or a C6-C20 aryl group.

In other embodiments, the acid may be formed of alkyl sulfonic acid, aryl sulfonic acid, taurine, perfluorooctane sulfonate (PFOS), tetrafluoroethylene-perfluoro-3,6-dioxa-4-methyl-7-octenesulfonic acid, ethanesulfonyl fluoride, tetrafluoroethylene, trifluoromethanesulfonic acid, sulfamic acid, oxalic acid, sodium dodecylbenzene sultanate, or mixtures thereof.

In some embodiments, the oxidizing agent may be formed of chlorine dioxide, phosphoric acid, nitric acid, hydrochloric acid, hydrogen peroxide, alkyl peroxide, aryl peroxide, ammonium persulfate (APS), ammonium perchlorate (APC), or mixtures thereof. The alkyl peroxide may include a C1-C10 alkyl group. The aryl peroxide may include a C6-C20 aryl group.

In other embodiments, the oxidizing agent may include a compound represented by Formula 2.

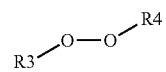

[Formula 2]

where R3 and R4 are each independently a hydrogen atom, a C1-C10 alkyl group, or a C6-C20 aryl group.

In some embodiments, the mixture prepared in operation P12 may include about 75 to about 99 wt % MSA, about 0.1 to about 10 wt % hydrogen peroxide, and about 0.1 to about 20 wt % DIW, based on the total weight of the mixture.

In some embodiments, when the mixture is prepared according to operation P12 by using MSA as the organic acid and using hydrogen peroxide as the oxidizing agent, 99.9% pure MSA and a 30% pure hydrogen peroxide aqueous solution may be mixed at a volume ratio in the range of about 3:1 to about 10:1.

The mixture may include about 75 to about 99 wt % MSA, about 0.1 to about 10 wt % hydrogen peroxide, and about 0.1 to about 20 wt % DIW.

In some embodiments, when the mixture is prepared in operation P12, an azole compound, such as triazole, tetrazole, pentazole, or benzotriazole, may be further added. The azole compound may be added to be less than about 1 wt % of the mixture. The azole compound may prevent corrosion of a metal.

In operation P14, the cleaning composition is prepared by stirring the mixture.

The organic acid contained in the cleaning composition may be about 75 to about 99 wt %, the oxidizing agent contained therein may be about 0.1 to about 10 wt %, and the DIW contained therein may be about 0.1 to about 20 wt %.

The cleaning composition may have a pH of 5 or less. To adjust the pH of the cleaning composition, the content of the organic acid may be controlled when the mixture is prepared in operation P12.

In some embodiments, the cleaning composition may further include an azole compound of less than 1 wt %. In the case that the azole compound is included in the cleaning composition, when a photomask having a metal-containing layer is wet-processed using the cleaning composition as described below with reference to FIGS. 3D and 5B, improvement in the prevention of corrosion or etching of a metal included in the metal-containing layer may be observed.

Figure 2:
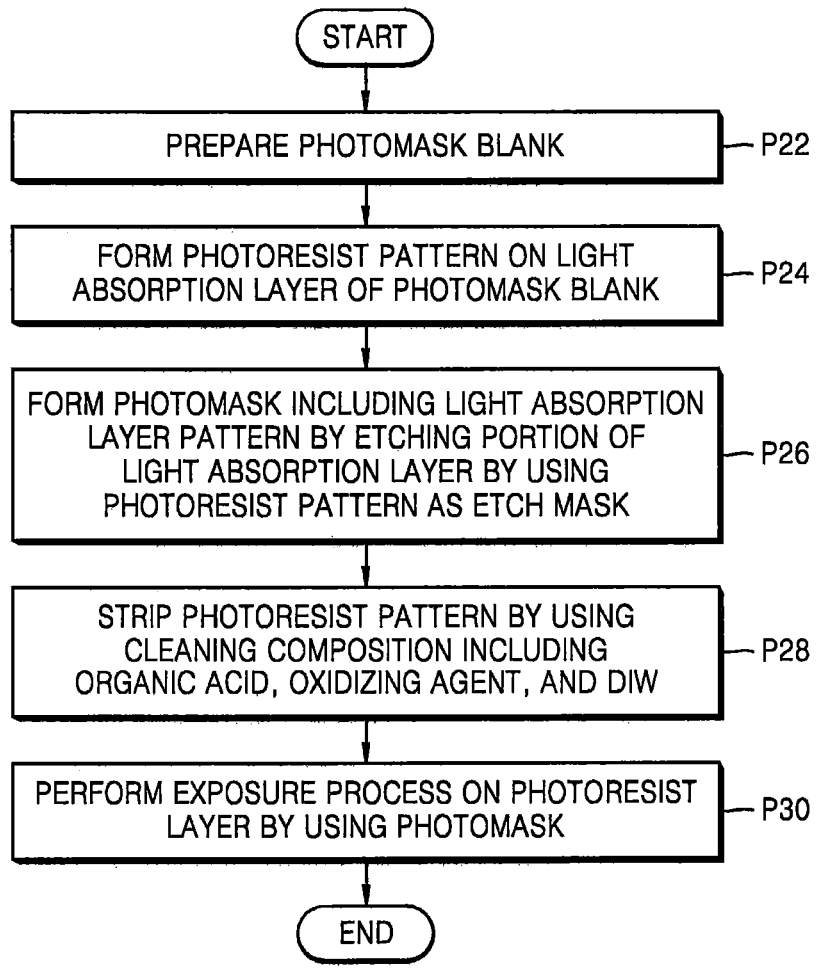
FIG. 2 is a flowchart of a method of manufacturing an integrated circuit (IC) device, according to embodiments of the inventive concept.

FIG. 2 is a flowchart of a method of manufacturing an integrated circuit (IC) device, according to embodiments of the present inventive concept.

FIGS. 3A-3F are cross-sectional views for explaining the method of manufacturing an IC device illustrated in FIG. 2.

Figure 3A:
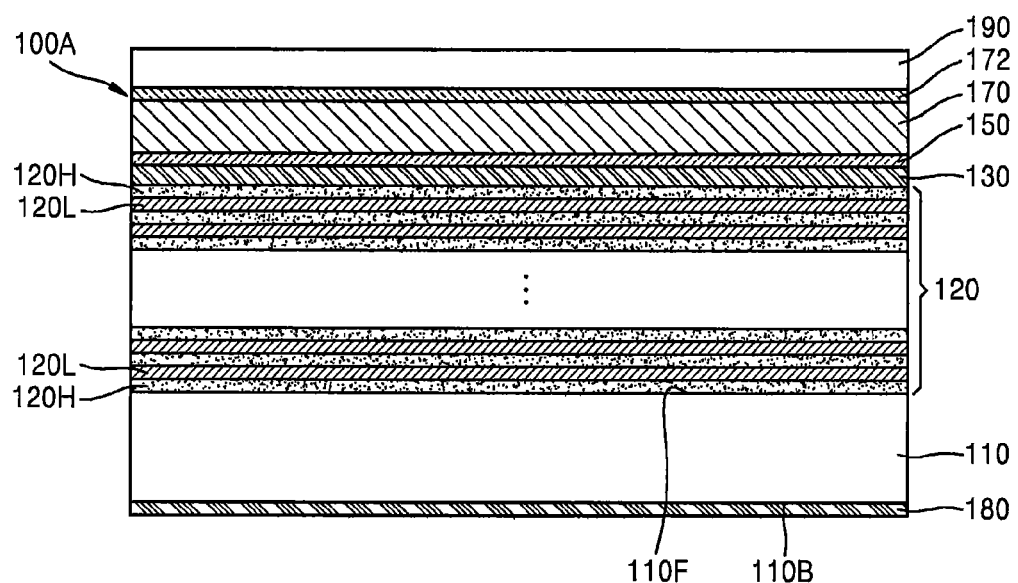
FIGS. 3A-3F are cross-sectional views for explaining the method of manufacturing an IC device illustrated in FIG. 2.

Referring to FIGS. 2 and 3A, in operation P22, a photomask blank 100A is prepared.

The photomask blank 100A may include a photomask substrate 110, a multiple reflection layer 120 formed on a front-side surface 110F of the photomask substrate 110, a capping layer 130 formed on the multiple reflection layer 120, a buffer layer 150 formed on the capping layer 130, and a light absorption layer 170 and a low reflection layer 172 sequentially formed on the buffer layer 150. In some embodiments, at least one selected from the group consisting of the buffer layer 150 and the low reflection layer 172 is not formed. A backside conductive layer 180 may be formed on a rear-side surface 110B of the photomask substrate 110.

The photomask substrate 110 may be formed of a dielectric, glass, a semiconductor, or a metal material. For example, the photomask substrate 110 may be formed of composite quartz glass, quartz glass, aluminosilicate glass, soda lime glass, low thermal expansion material (LTEM) glass (e.g., $SiO_2$—$TiO_2$-based glass), crystallized glass obtained by precipitating a β-quartz solid solution, monocrystalline silicon, or silicon carbide (SiC).

The multiple reflection layer 120 has a multi-layered mirror structure obtained by alternately stacking a high refractive index layer 120H and a low refractive index layer 120L a plurality of times. For example, the multiple reflection layer 120 may be a periodic Mo/Si multi-layer, a periodic Mo compound/Si compound multi-layer, a periodic Ru/Si multi-layer, a periodic Be/Mo multi-layer, a periodic Si/Nb multi-layer, a periodic Si/Mo/Ru multi-layer, a periodic Si/Mo/Ru/Mo multi-layer, or a periodic Si/Ru/Mo/Ru multi-layer.

The capping layer 130 may include a metal. The capping layer 130 may protect the multiple reflection layer 120 so that the multiple reflection layer 120 is not damaged during an etch process for manufacturing a photomask by patterning the photomask blank 100A or during a defect repair process, and may prevent a surface of the multiple reflection layer 120 from being oxidized. In some embodiments, the capping layer 130 may include at least one transition metal selected from the group consisting of Ru, Ni, and Ir.

The buffer layer 150 may protect the capping layer 130 so that the capping layer 130 is not damaged while the light absorption layer 170 is being dry-etched to form a reflective photomask from the photomask blank 100A. The buffer layer 150 may be formed of Ru, RuB, RuSi, Cr, Cr nitride, Al, Al nitride, Ta, Ta nitride, Pt, Ir, Pd, $SiO_2$, $Si_3N_4$, $Al_2O_3$, or mixtures thereof.

The light absorption layer 170 may be formed of a material that absorbs EUV light and has low reflectance with respect to EUV light. In some embodiments, the light absorption layer 170 may be formed of a material of which a maximum reflectance is about 5% or less with respect to light having a wavelength of around 13.5 nm when light having the same wavelength band as EUV light is radiated on a surface of the light absorption layer 170. The light absorption layer 170 may be formed of a material containing Ta as a main component. In some embodiments, the light absorption layer 170 may include Ta as the main component and also include at least one selected from the group consisting of Hf, Si, Zr, Ge, B, N, and H. For example, the light absorption layer 170 may be formed of TaO, TaN, TaHf, TaHfN, TaBSi, TaBSiN, TaB, TaBN, TaSi, TaSiN, TaGe, TaGeN, TaZr, TaZrN, or mixtures thereof.

During inspection of a photomask, the low reflection layer 172 may allow a sufficient contrast to be obtained, by providing a relatively low reflectance with respect to inspection light having a wavelength band of, for example, in a range of about 190 to about 260 nm. For example, the low reflection layer 172 may be formed of TaBO, TaBNO, TaOH, TaON, or TaONH.

A mask layer 190 may be formed on the low reflection layer 172. The mask layer 190 may be a hard mask layer. For example, the hard mask layer may be formed of oxide, nitride, polysilicon, or mixtures thereof. In some embodiments, the mask layer 190 may not be formed.

The backside conductive layer 180 formed on the rear-side surface 110B of the photomask substrate 110 may be favorably used when the photomask substrate 110 is supported using an electrostatic chuck in order to prevent the photomask substrate 110 from being bent during an exposure process. The backside conductive layer 180 may be formed of Cr or CrN.

Figure 3B:
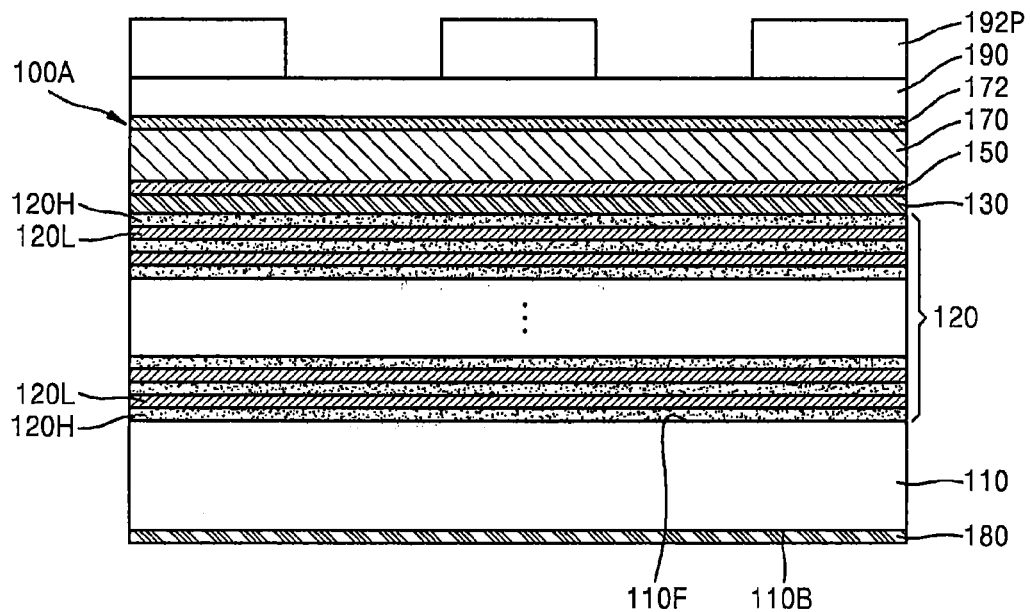

Referring to FIGS. 2 and 3B, in operation P24, a photoresist pattern 192P is formed on the light absorption layer 170 of the photomask blank 100A.

As illustrated in FIG. 3B, when the mask layer 190 is formed on the light absorption layer 170, the photoresist pattern 192P is formed on the mask layer 190.

The photoresist pattern 192P may be formed of a photoresist material for use in electron beam lithography. The photoresist pattern 192P may be formed of a positive photoresist or a negative photoresist. In some embodiments, the photoresist pattern 192P may have a thickness in a range of about 50 to about 100 nm, but the thickness of the photoresist pattern 192P is not limited thereto.

Figure 3C:
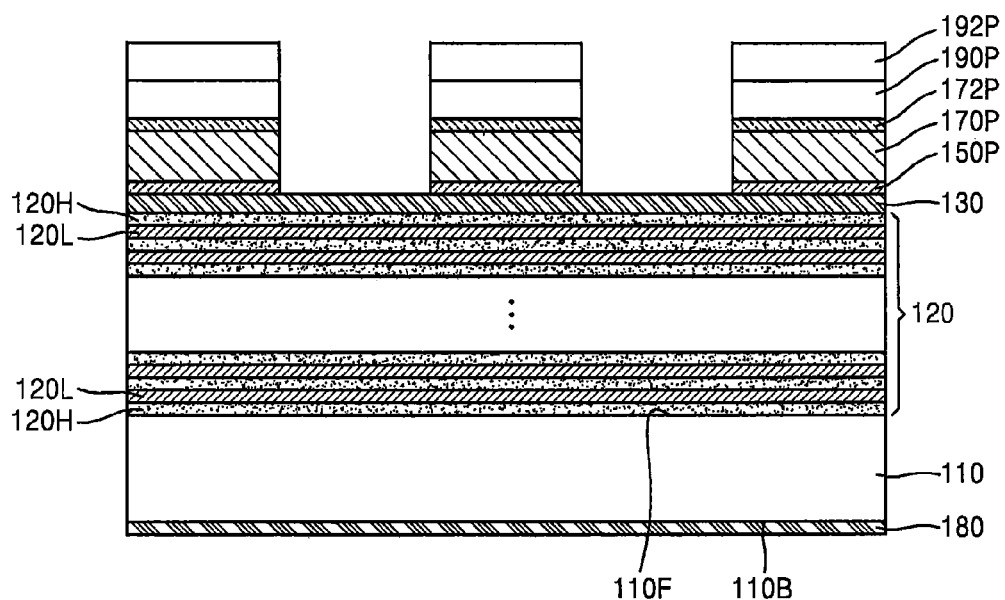

Referring to FIGS. 2 and 3C, in operation P26, a portion of the light absorption layer 170 is etched using the photoresist pattern 192P as an etch mask, and thus, a reflective photomask PM including a light absorption layer pattern 170P is formed.

In more detail, first, the mask layer 190 is etched using the photoresist pattern 192P as an etch mask to thereby form a mask pattern 190P, and then, the low reflection layer 172, the light absorption layer 170, and the buffer layer 150 are sequentially etched using the photoresist pattern 192P and the mask pattern 190P as etch masks to thereby form a low reflection pattern 172P, the light absorption layer pattern 170P, and a buffer pattern 150P. Thus, the reflective photomask PM including the light absorption layer pattern 170P having a desired shape is formed.

Figure 3D:
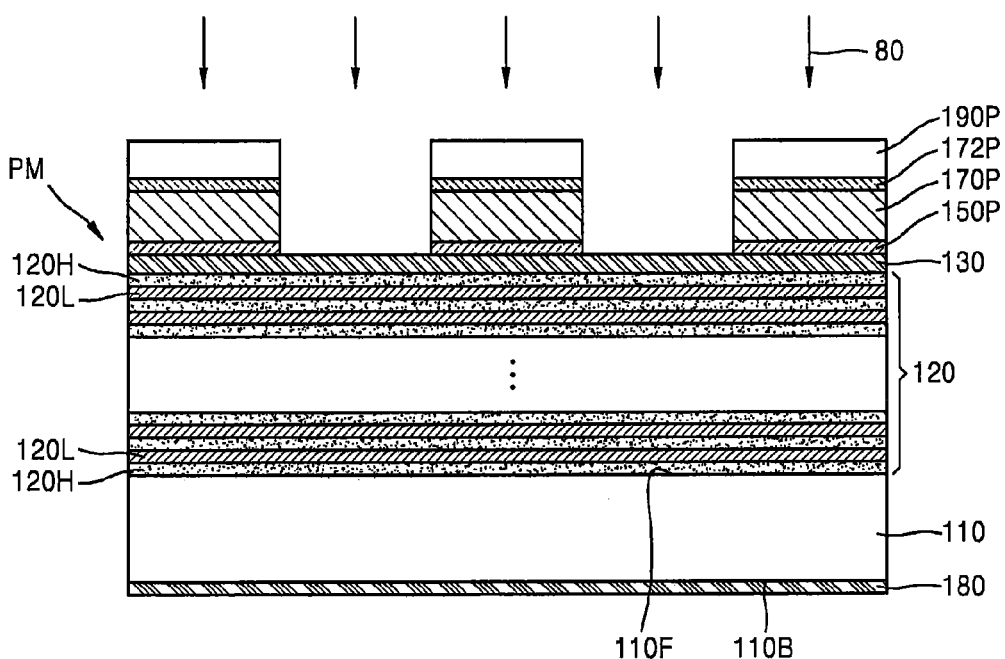

Referring to FIGS. 2 and 3D, in operation P28, the photoresist pattern 192P of FIG. 3D is stripped off using a cleaning composition 80 according to embodiments of the present inventive concept.

The cleaning composition 80 may include an organic acid, an oxidizing agent, and DIW. The cleaning composition 80 may be the cleaning composition obtained in operations P12 and P14 of FIG. 1.

To strip the photoresist pattern 192P by using the cleaning composition 80, while the cleaning composition 80 is kept in a temperature range from room temperature to 90° C., for example, in a range from about 20 to about 80° C., the reflective photomask PM covered with the photoresist pattern 192P may be dipped in the cleaning composition 80 for a period of time in a range from about 1 to about 30 minutes.

In some embodiments, to reduce the time required to remove the photoresist pattern 192P, when the reflective photomask PM is dipped in the cleaning composition 80, the cleaning composition 80 may be stirred or ultrasound waves may be applied to the cleaning composition 80. In other embodiments, to reduce the time required to remove the photoresist pattern 192P, when the reflective photomask PM is dipped in the cleaning composition 80, the cleaning composition 80 may be stirred while shaking the reflective photomask PM by applying a physical force to the reflective photomask. Alternatively, when the reflective photomask PM is dipped in the cleaning composition 80, ultrasound waves may be applied to the cleaning composition 80 while shaking the reflective photomask PM by applying a physical force to the reflective photomask.

While the photoresist pattern 192P is being stripped using the cleaning composition 80, the capping layer 130, the buffer pattern 150P, the light absorption layer pattern 170P, and the low reflection pattern 172P of the reflective photomask PM may be exposed to the cleaning composition 80.

The cleaning composition 80 may not include an inorganic acid having a relatively strong metal oxidizing power. The cleaning composition 80 may include an organic acid having a relatively weak metal oxidizing power, instead of an inorganic acid. Accordingly, even when the capping layer 130, the buffer pattern 150P, the light absorption layer pattern 170P, and the low reflection pattern 172P of the reflective photomask PM, each including a metal, are exposed to the cleaning composition 80 while the photoresist pattern 192P is being stripped using the cleaning composition 80, these components containing the metal may not be damaged and organic materials that constitute the photoresist pattern 192P may be effectively removed. Thus, an undesired change in the CD of the light absorption layer pattern 170P of the reflective photomask PM after the photoresist pattern 192P is removed using the cleaning composition 80 may be prevented.

Additionally, by using an oxidizing agent including an alkyl group and/or an aryl group, for example, MSA, as the oxidizing agent included in the cleaning composition 80, even when the capping layer 130, the buffer pattern 150P, the light absorption layer pattern 170P, and the low reflection pattern 172P of the reflective photomask PM, each including a metal, are exposed to the cleaning composition 80 while the photoresist pattern 192P is being stripped using the cleaning composition 80, the metals included in these components may be prevented from being etched by the cleaning composition 80 and thus consumed.

Figure 3E:
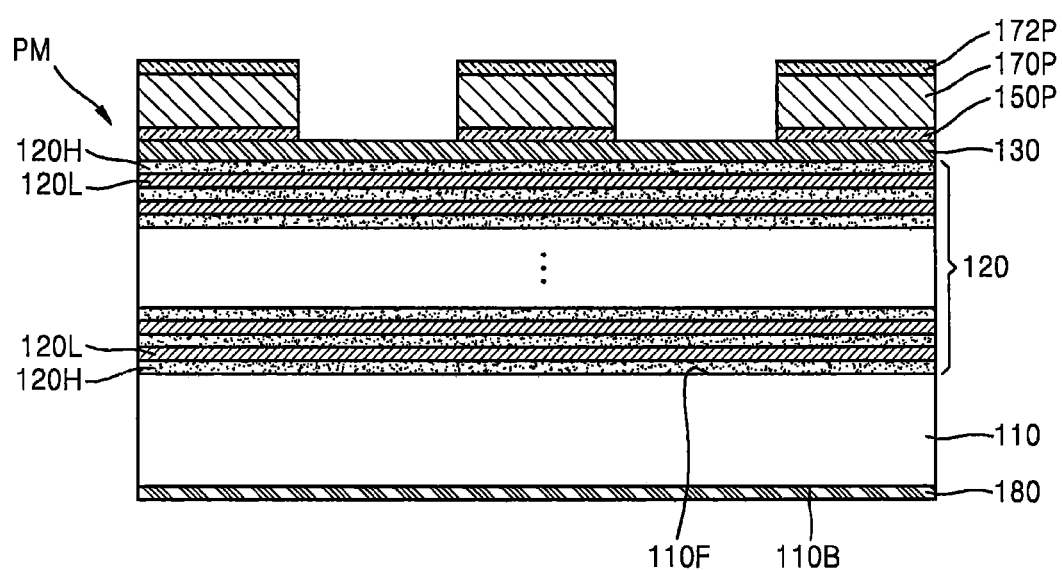

Referring to FIG. 3E, the mask pattern 190P (see FIG. 3D) is removed so that an upper surface of the low reflection pattern 172P is exposed.

Figure 3F:
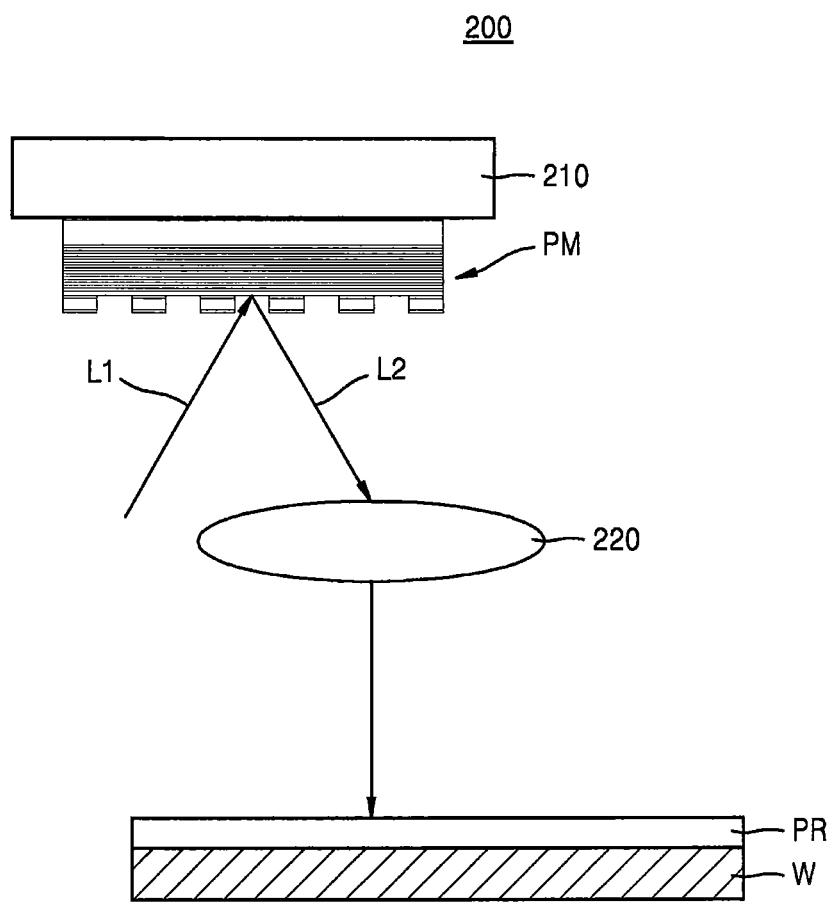

Referring to FIGS. 2 and 3F, in operation P30, an exposure process is performed on a photoresist layer PR formed on a wafer W, by using the reflective photomask PM.

During the exposure process, EUV L1 may be radiated onto the reflective photomask PM fixed to an electrostatic chuck 210 of an EUV lithography system 200, and light L2 reflected by the multiple reflection layer 120 (see FIG. 3E) of the reflective photomask PM may be radiated onto the photoresist layer PR on the wafer W via a projection optical system 220.

Figure 4:
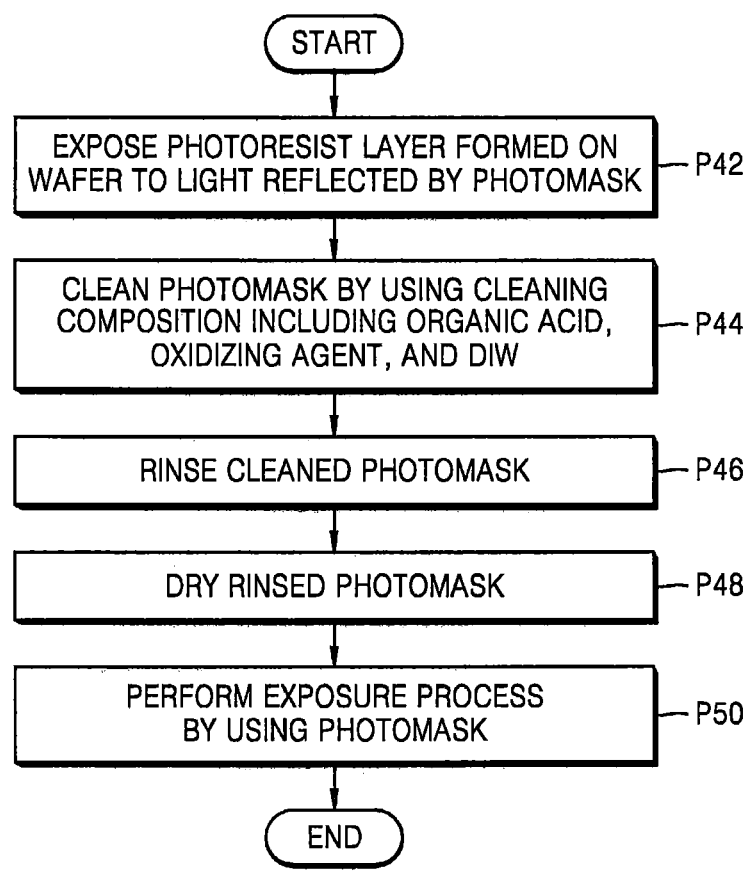
FIG. 4 is a flowchart of a method of manufacturing an IC device, according to other embodiments of the inventive concept.

FIG. 4 is a flowchart of a method of manufacturing an IC device, according to other embodiments of the present inventive concept.

Figure 5A:
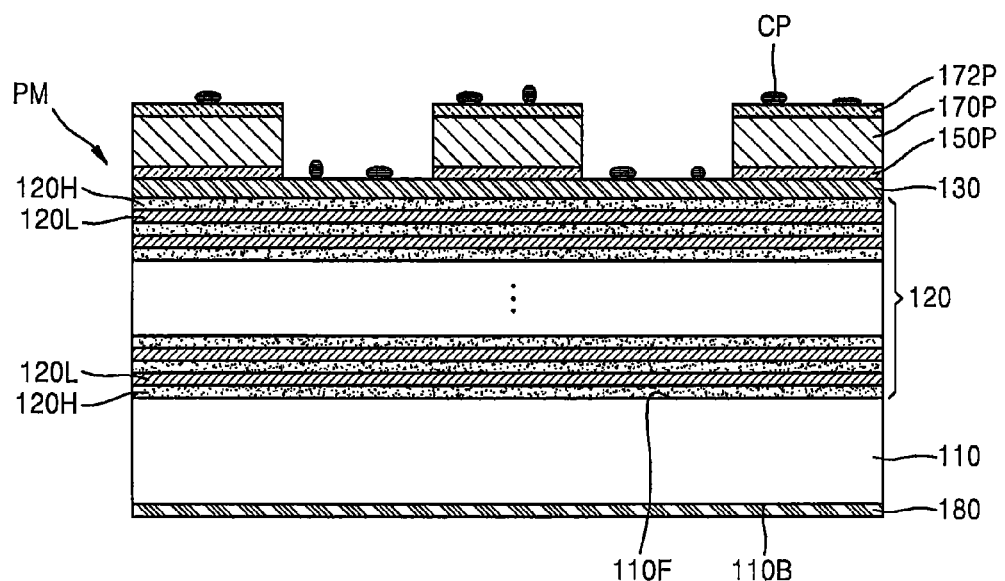
FIGS. 5A and 5B are cross-sectional views for explaining the method of manufacturing an IC device illustrated in FIG. 4.
Figure 5B:
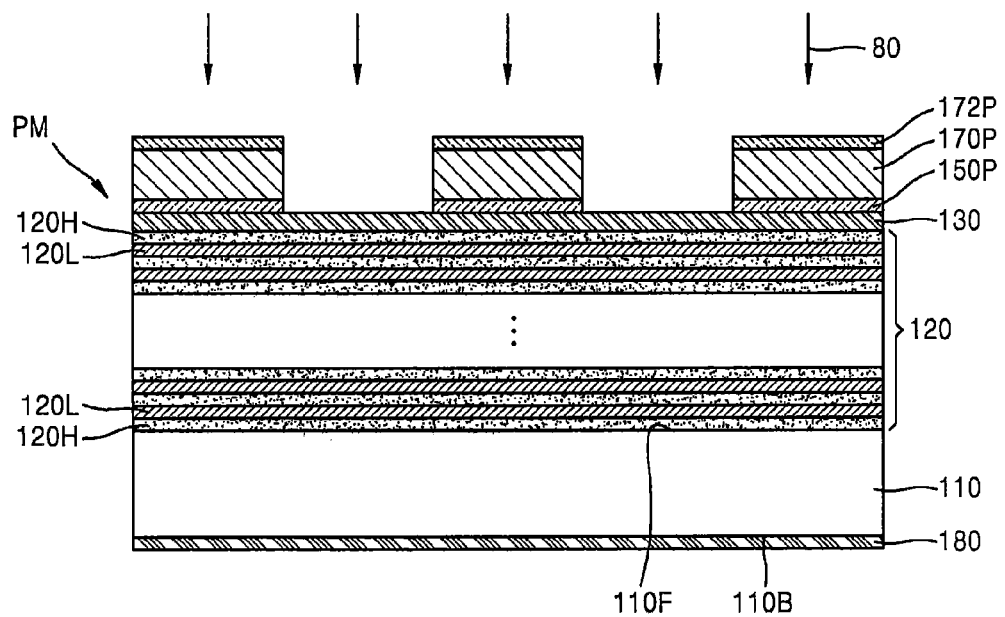

FIGS. 5A and 5B are cross-sectional views for explaining the method of manufacturing an IC device illustrated in FIG. 4.

Referring to FIG. 4, in operation P42, a photoresist layer formed on a wafer is exposed to light reflected by a photomask.

In some embodiments, to perform the exposure according to operation P42, operation P30 of FIG. 2 and the process described above with reference to FIG. 3F may be performed. For convenience of explanation, the wafer W and the photoresist layer PR of FIG. 3F will now be described as illustrated.

FIG. 5A illustrates a photomask PM obtained by performing an exposure process according to operation P42 of FIG. 4. Although the reflective photomask PM of FIG. 3E is used as the photomask PM in FIG. 5A, embodiments of the present inventive concept are not limited thereto. For example, an exposure process may be performed using a photomask obtained by transforming or changing the structure of the reflective photomask PM of FIG. 3E without departing from the scope of the present inventive concept.

As illustrated in FIG. 5A, after the exposure process is performed in operation P42 of FIG. 4 or while the exposure process is being performed in operation P42 of FIG. 4, a surface of the reflective photomask PM may be contaminated by a contaminant CP including an organic residue, particles, and the like, at least due to an organic contaminant remaining on the wafer W or on the photoresist layer PR formed on the wafer W.

Referring to FIGS. 4 and 5B, in operation P44, the reflective photomask PM is cleaned using the cleaning composition 80 including an organic acid, an oxidizing agent, and DIW to thereby remove the contaminant CP (see FIG. 5A) from the surface of the reflective photomask PM. The cleaning composition 80 may be the cleaning solution obtained according to the preparing method of FIG. 1.

To clean the reflective photomask PM by using the cleaning composition 80, while the cleaning composition 80 is kept in a temperature range from room temperature to 90° C., for example, in a range from about 20 to about 80° C., the reflective photomask PM contaminated by the contaminant CP may be dipped in the cleaning composition 80 for a period of time in a range from about 1 to about 30 minutes.

In some embodiments, to reduce the time required to clean the reflective photomask PM, when the reflective photomask PM is dipped in the cleaning composition 80, the cleaning composition 80 may be stirred or ultrasound waves may be applied to the cleaning composition 80. In other embodiments, to reduce the time required to clean the reflective photomask PM, when the reflective photomask PM is dipped in the cleaning composition 80, the cleaning composition 80 may be stirred and at the same time the reflective photomask PM may be shaken by applying a physical force to the reflective photomask PM. Alternatively, when the reflective photomask PM is dipped in the cleaning composition 80, ultrasound waves may be applied to the cleaning composition 80 and at the same time the reflective photomask PM may be shaken by applying a physical force to the reflective photomask PM.

While the reflective photomask PM is being cleaned using the cleaning composition 80, the capping layer 130, the buffer pattern 150P, the light absorption layer pattern 170P, and the low reflection pattern 172P of the reflective photomask PM may be exposed to the cleaning composition 80.

The cleaning composition 80 may not include an inorganic acid having a relatively strong metal oxidizing power and instead may include an organic acid having a relatively weak metal oxidizing power. Accordingly, even when the capping layer 130, the buffer pattern 150P, the light absorption layer pattern 170P, and the low reflection pattern 172P of the reflective photomask PM, each including a metal, are exposed to the cleaning composition 80 while the reflective photomask PM is being cleaned using the cleaning composition 80, the components containing the metals may not be damaged and the contaminant CP including an organic residue and/or particles may be effectively removed by the cleaning composition 80.

Additionally, by using an oxidizing agent including an alkyl group and/or an aryl group, for example, MSA, as the oxidizing agent included in the cleaning composition 80, even when the capping layer 130, the buffer pattern 150P, the light absorption layer pattern 170P, and the low reflection pattern 172P of the reflective photomask PM, each including a metal, are exposed to the cleaning composition 80 while the reflective photomask PM is being cleaned using the cleaning composition 80, the metals contained in these components may be prevented from being etched by the cleaning composition 80 and thus consumption of these components may be prevented.

Accordingly, the CD of the light absorption layer pattern 170P of the reflective photomask PM may be prevented from being undesirably changed after the contaminant CP is removed using the cleaning composition 80, and thus undesired photomask errors, such as a flatness error, a thickness variation, and CD uniformity (CDU), may be prevented from occurring at least due to the undesired change in the reflective photomask PM.

In a comparative example, when a sulfuric peroxide mixture (SPM) is used to clean the reflective photomask PM contaminated by the contaminant CP, as illustrated in FIG. 5A, the reflective photomask PM is exposed under a cleaning atmosphere including an inorganic acid having a relatively strong metal oxidizing power, and thus, an exposed surface of the reflective photomask PM is prone to damage.

In particular, when a cleaning process using an SPM is repeatedly performed on a photomask that is used in a EUV exposure process not using pellicles, metal components may be excessively damaged and/or etched from a surface of the photomask that is repeatedly exposed to the SPM in the process of repeating the cleaning processes. Thus, the CD of a light-shield layer pattern included in the photomask degrades, and the lifetime of the photomask decreases.

In contrast, in a method of manufacturing an IC device, according to an embodiment of the present inventive concept, when the reflective photomask PM is cleaned using the cleaning composition 80 including organic acid, an oxidizing agent, and DIW, damage of the reflective photomask PM may be prevented, and at the same time the contaminant CP may be effectively removed. Therefore, the lifetime of the reflective photomask PM may improve.

In operation P46 of FIG. 4, the cleaned reflective photomask PM is rinsed.

The reflective photomask PM may be rinsed using DIW.

In some embodiments, to rinse the reflective photomask PM, the reflective photomask PM may be dipped in DIW for several minutes, and in some instances, for about one minute. While the reflective photomask PM is being dipped in the DIW, the DIW may be stirred simultaneously.

In operation P48 of FIG. 4, the reflective photomask PM is dried.

The reflective photomask PM may be dried using an inert gas or isopropyl alcohol (IPA). In some embodiments, to dry the reflective photomask PM, $N_2$ gas or IPA may be supplied to the reflective photomask PM.

In operation P50 of FIG. 4, an exposure process is performed using the reflective photomask PM.

In some embodiments, when the exposure process is performed in operation P50, the EUV L1 may be radiated onto the reflective photomask PM fixed to the electrostatic chuck 210 of the EUV lithography system 200, and the light L2 reflected by the multiple reflection layer 120 (see FIG. 3E) of the reflective photomask PM may be radiated to the photoresist layer PR on the wafer W via the projection optical system 220, similar to the description given with reference to FIGS. 2 and 3F.

While the exposure process is being performed in operation P50, a pattern having a desired shape may be effectively transferred to an accurate location on the wafer W by using the reflective photomask PM cleaned using the cleaning composition 80 (see FIG. 5B).

Evaluation Example 1

Table 1 shows a result of evaluating positive photoresist PR (photoresist)) removability, negative PR removability, a metal protection effect, and carbon residue removability according to various compositions of a cleaning solution according to embodiments of the present inventive concept.

TABLE 1

|  | organic acid (wt %) | oxidizing agent (wt %) | DIW (wt %) | positive PR removability | negative PR removability | metal protection | carbon residue removability |
|---|---|---|---|---|---|---|---|
| Embodiment 1 | 60-70% | 10% | 20-25% | ◎ | Δ | ◎ | Δ |
| Embodiment 2 | 80-90% | 5% | 10-15% | ◎ | ◎ | ◎ | ◎ |
| Embodiment 3 | 90-85% | 2% | 5-10% | ◎ | Δ | ◎ | Δ |

In the evaluation of Table 1, cleaning compositions including an organic acid, an oxidizing agent, and DIW at various composition ratios were prepared, and positive PR removability, negative PR removability, metal protection, and carbon residue removability of each of the cleaning compositions were evaluated. MSA was used as the organic acid, and hydrogen peroxide was used as the oxidizing agent.

To evaluate the positive PR removability, while the cleaning compositions having various composition ratios according to Embodiments 1-3 are kept at 25° C., evaluation samples were dipped within the cleaning compositions for one minute, and it was observed whether positive PRs were completely removed from the evaluation samples. A photoresist layer obtained using XPF-355 by FUJIFILM Electronic Materials (FFEM) was used as the positive PRs.

To evaluate the negative PR removability, while the cleaning compositions having various composition ratios according to Embodiments 1-3 are kept at 80° C., evaluation samples were dipped within the cleaning compositions for one minute, and it was observed whether negative PRs were completely removed from the evaluation samples. A photoresist layer obtained using SEBN-1702 by Shin-Etsu Chemical Co., Ltd. was used as the negative PRs.

To evaluate the metal protection effect, while 100 ml of each of the cleaning compositions having various composition ratios according to Embodiments 1-3 was kept at 25° C., metal-containing material specimens were dipped within the cleaning compositions for one hour. Thereafter, the metal-containing material specimens were taken out of the cleaning compositions, and metal-containing material consumption amounts were measured from the metal-containing material specimens. TaN, TaBN, and TABO specimens were used as the metal-containing material specimens. When a TaN specimen was used, metal-containing material consumption amounts were measured using an ellipsometer. When TaBN and TABO specimens were used, the concentrations of Ta-containing materials that remained within the cleaning compositions after the metal-containing material specimens were taken out of the cleaning compositions, which were to be evaluated, were measured by inductively coupled plasma mass spectrometry (ICP-MS).

To evaluate the carbon residue removability, an EUV beam shot was radiated, for 90 seconds, to one point on a reflective photomask for evaluation having an upper surface via which an Ru layer and a TaBO layer are exposed. After it was checked that carbon residue was deposited around a location on the reflective photomask for evaluation onto which the EUV beam shot was projected, the reflective photomask for evaluation, on which the carbon residue was deposited, was dipped in the cleaning compositions having various composition ratios according to Embodiments 1-3 for one minute. At this time, the cleaning compositions were kept at 80° C.

In Table 1, "◎" represents excellent, "○" represents very good, "Δ" represents good, and "×" represents poor.

From the results of Table 1, it was confirmed that the evaluated characteristics of Embodiment 2 were all excellent.

Evaluation Example 2

Table 2 shows results of evaluating positive PR removability, negative PR removability, a metal protection effect, and carbon residue removability of cleaning compositions according to Comparative Examples 1-8 having various components and various compositions.

compositions according to Comparative Examples 1-8 were evaluated using the same method as that performed for Embodiments 1-3 of Table 1.

Comparative Example 1 is a cleaning composition obtained by mixing sulfuric acid and peroxide at a weight ratio of 19:1.

Comparative Example 2 is a cleaning composition obtained by mixing dimethyl sulfoxide (DMSO), tetramethylammonium hydroxide (TMAH), and DIW at a weight ratio of 15:5:80.

Comparative Example 3 is a cleaning composition obtained by mixing N-methyl-2-pyrrolidone (NMP), hydroxyl amine (hereinafter, referred to as "amine 1"), ethanol amine (hereinafter, referred to as "amine 2"), and DIW at a weight ratio of 38:8:16:38.

Comparative Example 4 is a cleaning composition obtained by mixing DMSO, amine 1, amine 2, and DIW at a weight ratio of 38:8:16:38.

Comparative Example 5 is a cleaning composition obtained by mixing sulfolane (SFL), amine 1, amine 2, and DIW at a weight ratio of 38:8:16:38.

Comparative Example 6 is a cleaning composition obtained by mixing solketal, amine 1, amine 2, and DIW at a weight ratio of 38:8:16:38.

Comparative Example 7 is a cleaning composition obtained by mixing SFL, amine 1, and amine 2 at a weight ratio of 76:8:16.

Comparative Example 8 is a cleaning composition obtained by mixing solketal, amine 1, and amine 2 at a weight ratio of 76:8:16.

The evaluations of Comparative Examples 1-8 were performed using the evaluation method for Embodiments 1-3.

In Table 2, "◎" represents excellent, "○" represents very good, "Δ" represents good, and "×" represents poor.

In Comparative Examples 1-8, it was confirmed that the metal protection effect and the carbon residue removability were generally poor.

Evaluation Example 3

Under the conditions shown in Table 3, the positive PR removability and the negative PR removability of each of the cleaning compositions according to Embodiment 2 of

TABLE 2

| | cleaning composition (wt %) | | positive PR removability | negative PR removability | metal protection | carbon residue removability |
|---|---|---|---|---|---|---|
| Comparative Example 1 | sulfuric acid/peroxide | 19:1 | ◎ | ○ | X | X |
| Comparative Example 2 | DMSO/TMAH/DIW | 15:5:80 | ◎ | ◎ | X | Δ |
| Comparative Example 3 | NMP/amine 1/amine 2/DIW | 38:8:16:38 | ◎ | X | X | X |
| Comparative Example 4 | DMSO/amine 1/amine 2/DIW | 38:8:16:38 | ◎ | X | X | X |
| Comparative Example 5 | SFL/amine 1/amine 2/DIW | 38:8:16:38 | ◎ | X | X | X |
| Comparative Example 6 | solketal/amine 1/amine 2/DIW | 38:8:16:38 | ◎ | X | X | X |
| Comparative Example 7 | SFL/amine 1/amine 2 | 76:8:16 | ◎ | ◎ | X | X |
| Comparative Example 8 | solketal/amine 1/amine 2 | 76:8:16 | X | X | X | X |

For the evaluation of Table 2, the positive PR removability, the negative PR removability, the metal protection effect, and the carbon residue removability of each of the cleaning Table 1 and the cleaning composition according to Comparative Example 1 of Table 2 were evaluated using the same method as that used for the evaluation of Table 1.

TABLE 3

|  | positive PR removability | negative PR removability |
|---|---|---|
| Embodiment 2 | 1 min, 25° C. | 1 min, 80° C. |
| Comparative Example 1 | 1 min, 25° C. | 5 min, 80° C. |

According to the results of the evaluations under the conditions of Table 3, it was confirmed from Table 2 that a photoresist layer was effectively removed in each of Comparative Examples 1-8.

Evaluation Example 4

Figure 6A:
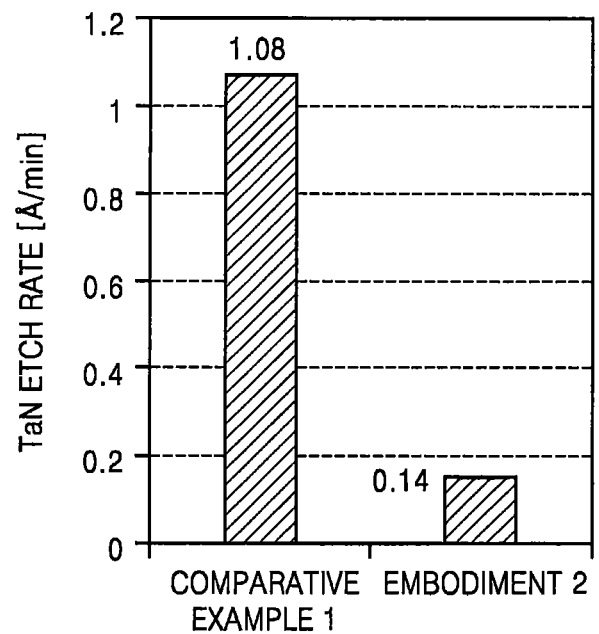
FIGS. 6A-6C are graphs showing results of evaluating the cleaning compositions according to Embodiment 2 and Comparative Example 1 in terms of protection of a metal-containing material layer.
Figure 6B:
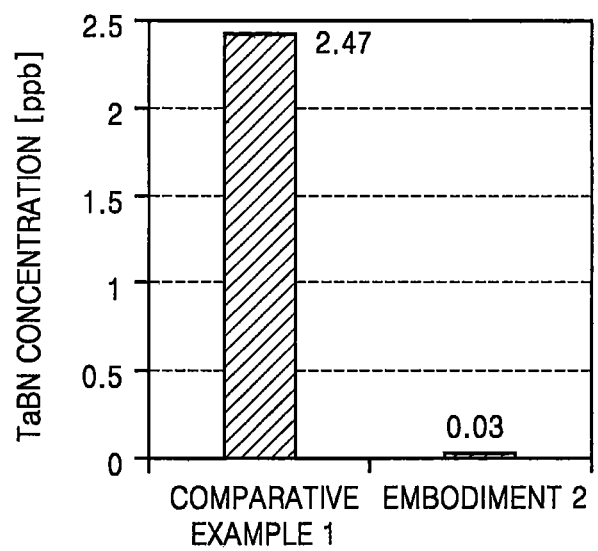
Figure 6C:
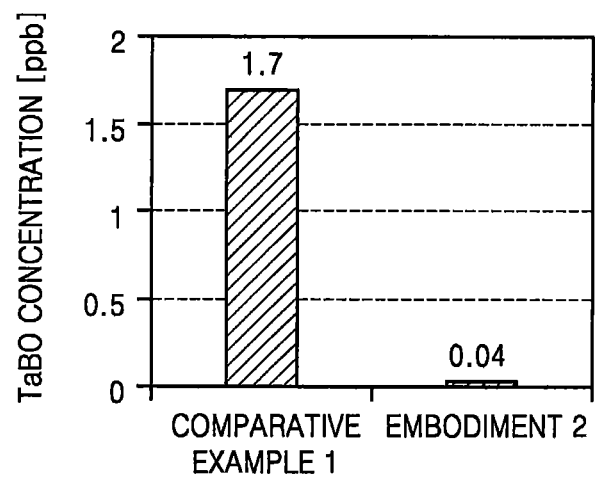

FIGS. 6A-6C are graphs showing results of evaluating the cleaning compositions according to Embodiment 2 and Comparative Example 1 in terms of protection of a metal-containing material layer.

For the evaluation of FIG. 6A, while each of 100 ml of the cleaning compositions according to Embodiment 2 and Comparative Example 1 were kept at 25° C., TaN specimens were dipped in the cleaning compositions for one hour, and then, the consumption of TaN was measured from the TaN specimens by using an ellipsometer.

For the evaluation of FIG. 6B, while each of 100 ml of the cleaning compositions according to Embodiment 2 and Comparative Example 1 were kept at 25° C., TaBN specimens were dipped in the cleaning compositions for one hour, and then, the concentration of Ta in the cleaning compositions was measured by ICP-MS.

For the evaluation of FIG. 6C, while each of 100 ml of the cleaning compositions according to Embodiment 2 and Comparative Example 1 were kept at 25° C., TaBO specimens were dipped in the cleaning compositions for one hour, and then, the concentration of Ta in the cleaning compositions was measured by ICP-MS.

It may be confirmed from the results of FIGS. 6A-6C that a metal protection effect of the cleaning composition according to Embodiment 2 is significantly greater than that of the cleaning composition according to Comparative Example 1.

Evaluation Example 5

Figure 7:
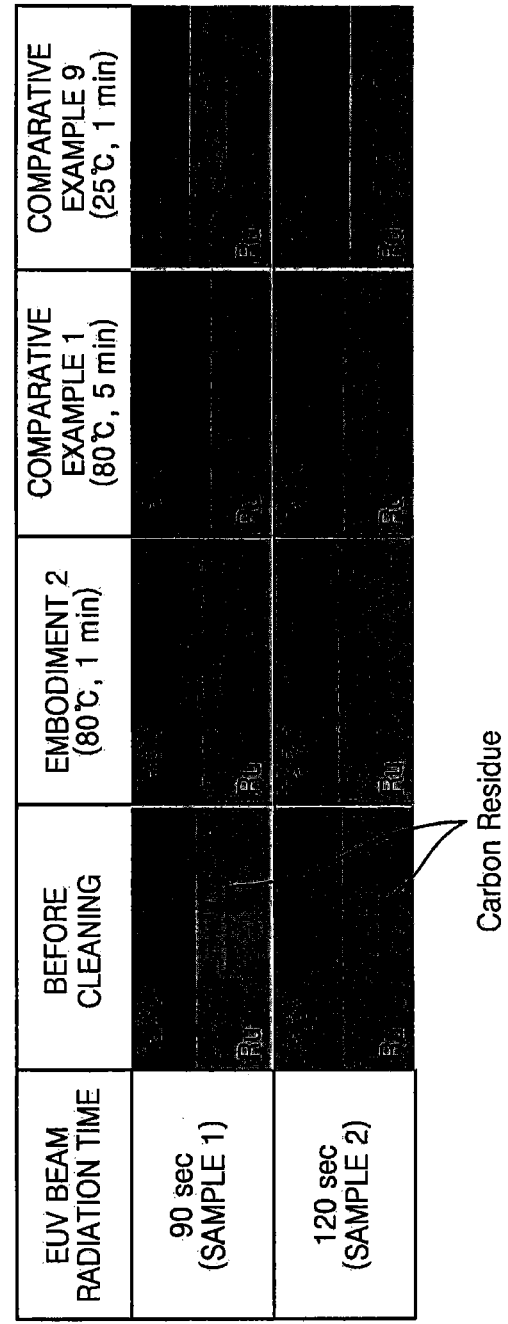
FIG. 7 is a table showing results of evaluating carbon residue removability of the cleaning composition according to Embodiment 2 and carbon residue removabilities of Comparative Examples 1 and 9.

FIG. 7 is a table showing results of evaluating carbon residue removability of the cleaning composition according to Embodiment 2 and carbon residue removabilities of Comparative Examples 1 and 9.

The cleaning composition according to Comparative Example 9 is formed of a 20% pure TMAH aqueous solution.

For the evaluation of FIG. 7, a sample 1 in which an EUV beam shot was radiated, for 90 seconds, to one point on a reflective photomask for evaluation having an upper surface on which an Ru layer and a TaBO layer are exposed, and a sample 2 in which an EUV beam shot was radiated to the one point on the reflective photomask for 120 seconds were prepared. After it was checked that carbon residue was deposited around a location on the reflective photomask of each of the samples 1 and 2, a not-yet-cleaned reflective photomask for evaluation having the carbon residue deposited thereon was dipped in the cleaning compositions according to Embodiment 2, Comparative Example 1, and Comparative Example 9 and was wet-processed. In the samples 1 and 2, a temperature and a dipping time of the cleaning composition according to Embodiment 2 respectively were 80° C. and one minute, a temperature and a dipping time of the cleaning composition according to Comparative Example 1 respectively were 80° C. and five minutes, and a temperature and a dipping time of the cleaning composition according to Comparative Example 9 respectively were 25° C. and one minute.

From the evaluation results of FIG. 7, it was confirmed that carbon residue was almost removed when being processed with the cleaning composition according to Embodiment 2, whereas carbon residue was rarely removed when being processed with the cleaning composition according to each of Comparative Examples 1 and 9.

In order to more closely evaluate the carbon residue removability by changing wet-processing conditions with respect to the cleaning compositions according to Embodiment 2 and Comparative Example 9, as compared with the evaluation of FIG. 7, the temperature and the dipping time of the cleaning composition according to Embodiment 2 were changed to 80° C. and 5 minutes, respectively, to thereby increase a wet-processing time compared with that in the evaluation of FIG. 7, and the temperature and the dipping time of the cleaning composition according to Comparative Example 9 were changed to 45° C. and 5 minutes, respectively, to thereby increase a wet-processing temperature compared with that in the evaluation of FIG. 7. Thus, a cleaning process for removing carbon residue was performed on each of the samples 1 and 2 of FIG. 7. For reference, it is generally difficult to increase the temperature of the cleaning composition according to Comparative Example 9 to be higher than 45° C., at least because of the characteristics of a component material of the cleaning composition.

Consequently, the carbon residue was completely removed when being processed with the cleaning composition according to Embodiment 2. In contrast, when being processed with the cleaning composition according to Comparative Example 9, the carbon residue was left without being completely removed in sample 2 where the EUV radiation time is 120 seconds.

Evaluation Example 6

Figure 8A:
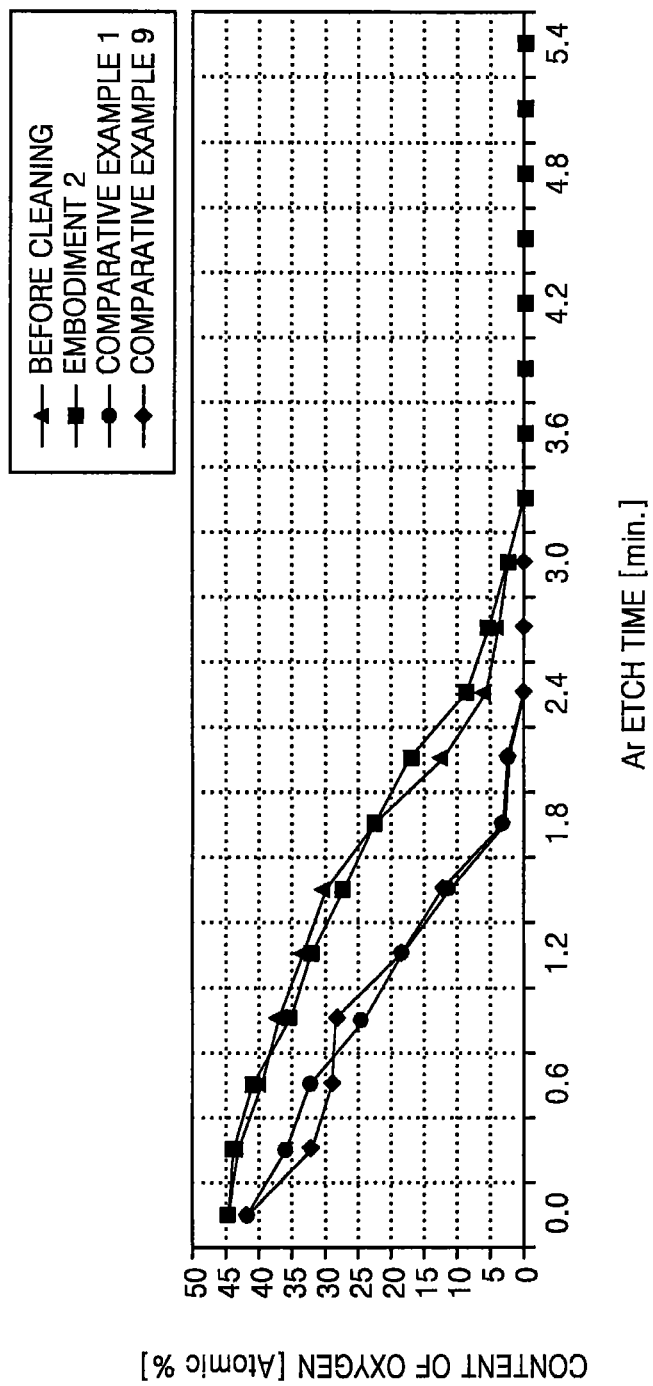
FIG. 8A is a table showing results of evaluating the cleaning compositions according to Embodiment 2, Comparative Example 1, and Comparative Example 9 in terms of protection of a metal-containing material layer.

FIG. 8A is a table showing results of evaluating the cleaning compositions according to Embodiment 2, Comparative Example 1, and Comparative Example 9 in terms of protection of a metal-containing material layer.

Figure 8B:
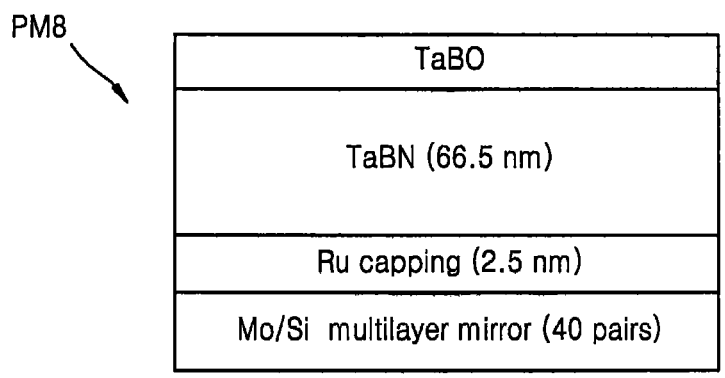
FIG. 8B is a cross-sectional view illustrating a structure of a reflective photomask used in the evaluation of FIG. 8A.

For the evaluation of FIG. 8A, while 100 ml of the cleaning composition according to Embodiment 2, 100 ml of the cleaning composition according to Comparative Example 1, and 100 ml of the cleaning composition according to Comparative Example 9 were kept at 80° C., 80° C., and 45° C., respectively, 1 cm×1 cm in-plane size specimens obtained from a reflective photomask PM8 having a cross-sectional structure illustrated in FIG. 8B were dipped in the cleaning compositions for one hour. The content of oxygen (O) was analyzed from a surface of a TaBO layer of the reflective photomask PM8 in a depth direction of the reflective photomask PM8 by performing X-ray photoelectron spectroscopy (XPS) on each of the specimens, and thus, a thickness of a residue of the TaBO layer was estimated.

As seen from the results of FIG. 8A, the time taken to etch the TaBO layer in the case of Embodiment 2 is about 3.5 minutes and the TaBO layer maintains a thickness similar to that in the case of a reflective photomask PM8 that is not yet cleaned. In contrast, the time taken to etch the TaBO layer in each of Comparative Examples 1 and 9 was about 2.4 minutes, and the thickness of the TaBO layer was reduced at least due to consumption of the TaBO layer by the cleaning composition according to each of Comparative Examples 1 and 9.

When the temperature of the cleaning composition according to Comparative Example 9 is set to 45° C., which is relatively high, as in the Evaluation example 5, the carbon residue removability improves but the ability to protect the metal-contained material layer degrades, compared with when the temperature of the cleaning composition according to Comparative Example 9 is 25° C.

However, the cleaning composition according to Embodiment 2 has high carbon residue removability and high metal-contained material layer protection ability within the evaluated temperature range.

Figure 9:
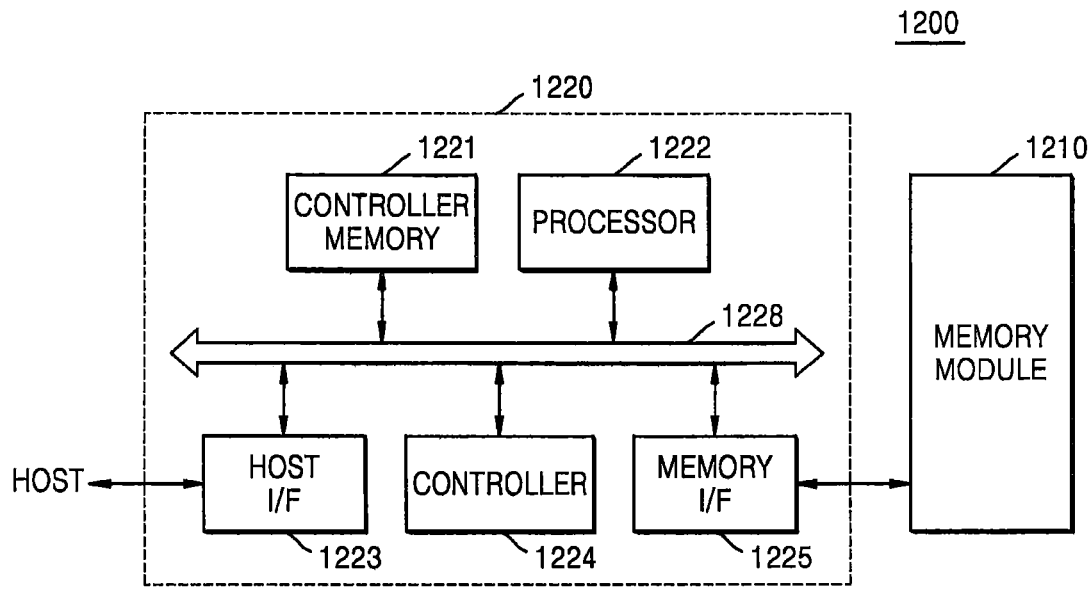
FIG. 9 is a block diagram of a memory card including an IC device manufactured using an IC device manufacturing method according to embodiments of the inventive concept.

FIG. 9 is a block diagram of a memory card 1200 including an IC device manufactured using an IC device manufacturing method according to embodiments of the present inventive concept.

The memory card 1200 includes a memory controller 1220 that generates a command signal and an address signal and a memory module 1210, for example, a flash memory including one flash memory device or a plurality of flash memory devices. The memory controller 1220 includes a host interface (I/F) 1223 that transmits or receives the command signal and the address signal to or from a host, and a memory I/F 1225 that transmits or receives the command signal and the address signal to or from the memory module 1210. The host I/F 1223, a controller 1224, and the memory I/F 1225 communicate with a controller memory 1221, such as static random access memory (SRAM), and a processor 1222, such as a central processing unit (CPU), through a common bus 1228.

The memory module 1210 receives the command signal and the address signal from the memory controller 1220, stores data in at least one of the memory devices of the memory module 1210 in response to the command signal and the address signal, and retrieves data from at least one of the memory devices. Each memory device of the memory module 1210 includes a plurality of addressable memory cells and a decoder that generates column signals and row signals to access at least one of the plurality of addressable memory cells during program and read operations.

The components included in the memory card 1200 including the memory controller 1220, namely, the memory module 1210 and the electronic devices 1221, 1222, 1223, 1224, and 1225 included in the memory controller 1220, may include IC devices manufactured using an IC device manufacturing method according to embodiments of the present inventive concept. The components included in the memory card 1200 including the memory controller 1220, namely, the memory module 1210 and the electronic devices 1221, 1222, 1223, 1224, and 1225 included in the memory controller 1220, may include IC devices manufactured using the IC device manufacturing method described above with reference to FIGS. 1-5B.

Figure 10:
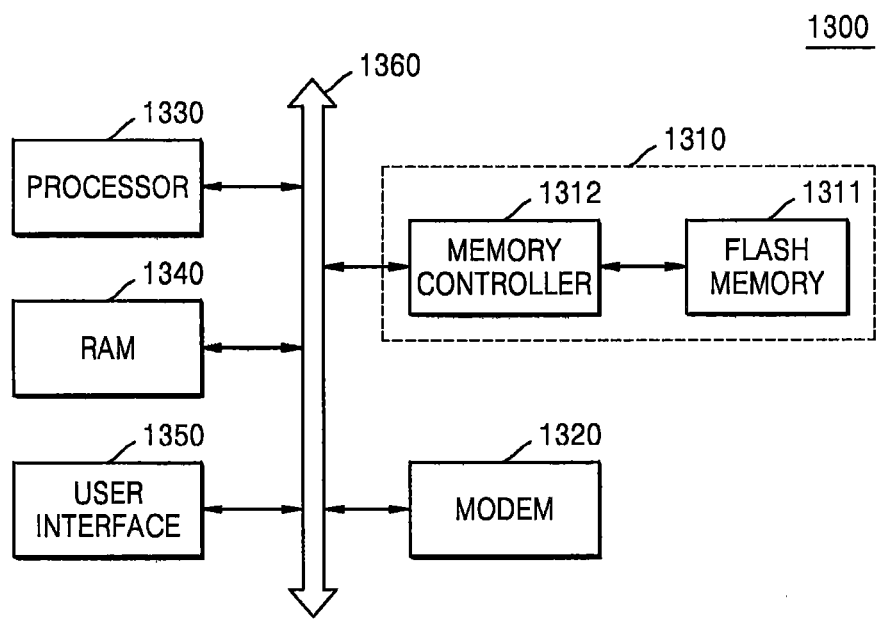
FIG. 10 is a block diagram of a memory system including an IC device manufactured using an IC device manufacturing method according to embodiments of the inventive concept.

FIG. 10 is a block diagram of a memory system 1300 including a memory card 1310 including an IC device manufactured using an IC device manufacturing method according to embodiments of the present inventive concept.

The memory system 1300 may include a processor 1330, such as a CPU, RAM 1340, a user interface 1350, and a modem 1320 that communicate with each other through a common bus 1360. Each of the components transmits a signal to the memory card 1310 and receives a signal from the memory card 1310 through the common bus 1360. The memory card 1310, the processor 1330, the RAM 1340, the user interface 1350, and the modem 1320 included in the memory system 1300 may include IC devices manufactured using an IC device manufacturing method according to embodiments of the present inventive concept. In particular, the components included in the memory system 1300 may include IC devices manufactured using the IC device manufacturing method described above with reference to FIGS. 1-5B.

The memory system 1300 may be applicable to various fields of electronics. For example, the memory system 1300 may be applicable to solid state drives (SSDs), CMOS image sensors (CISs), and a computer application chipset.

The memory systems and the devices may be packaged in any of various package forms including, but not limited to, ball grid arrays (BGAs), chip scale packages (CSPs), plastic leaded chip carrier (PLCC), plastic dual in-line package (PDIP), multi-chip package (MCP), wafer-level fabricated package (WFP), and wafer-level processed stack package (WSP).

In an IC device manufacturing method according to embodiments of the present inventive concept, a wet process of stripping a photoresist layer from a reflective photomask by using a cleaning composition according to the present inventive concept including an organic acid having relatively weak metal oxidizing power or cleaning the reflective photomask by using the cleaning composition is performed. Accordingly, even when components of the reflective photomask, each including metal, are exposed to the cleaning composition while the wet process is being performed on the reflective photomask, the components including the metals are not damaged. Moreover, the reflective photomask, in which metal-containing layers are exposed, is cleaned using the cleaning composition according to the present inventive concept, and thus, damage of the metal-containing layers may be prevented and at the same time a contaminant, such as carbon residue and particles, may be effectively removed. Accordingly, the CD of a light absorption layer pattern of the reflective photomask may be prevented from being undesirably changed after the contaminant is removed using the cleaning composition according to the present inventive concept, and thus, undesired errors, such as a flatness error, a thickness variation, and CDU, may be prevented from occurring due to the undesired change in the reflective photomask. By cleaning a photomask according to the IC device manufacturing method according to embodiments of the present inventive concept, damage of the photomask may be prevented, and a contaminant may be effectively removed. Therefore, the lifetime of the photomask may increase.

While the present inventive concept has been particularly shown and described with reference to exemplary embodiments thereof, it will be understood that various changes in form and details may be made therein without departing from the spirit and scope of the following claims.

What is claimed is:

1. A method of cleaning a photomask, the method comprising wet-processing a photomask using a cleaning composition comprising a sulfate, an oxidizing agent, and deionized water (DIW), wherein the sulfate comprises a compound resented by the following formula:

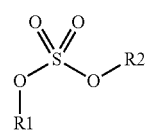

wherein R1 and R2 are each independently a C1-C10 alkyl group, or a C6-C20 aryl group.

2. The method of claim 1, wherein the cleaning composition comprises the sulfate in an amount of about 75 to about 99 wt %, the oxidizing agent in an amount of about 0.1 to about 10 wt %, and the DIW in an amount of about 0.1 to about 20 wt %.

3. The method of claim 1, wherein a pH of the cleaning composition is 5 or less.

4. The method of claim 1, wherein the oxidizing agent comprises chlorine dioxide, phosphoric acid, nitric acid, hydrochloric acid, hydrogen peroxide, alkyl peroxide, aryl peroxide, ammonium persulfate (APS), ammonium perchlorate (APC), or mixtures thereof.

5. The method of claim 1, wherein the oxidizing agent comprises a compound represented by the following formula:

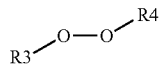

wherein R3 and R4 are each independently a hydrogen atom, a C1-C10 alkyl group, or a C6-C20 aryl group.

6. The method of claim 1, wherein the wet-processing of the photomask comprises contacting the photomask with the cleaning composition that is maintained at a temperature in a range of about 20 to about 80° C.

7. The method of claim 1, wherein before the wet-processing of the photomask, the method comprises:
preparing a photomask blank, the photomask blank comprising a substrate, a multiple reflection layer formed on the substrate, a capping layer formed on the multiple reflection layer and further comprising a metal, and a light absorption layer formed on the capping layer and further comprising a metal;
forming a photoresist pattern on the light absorption layer; and
forming a photomask including a light absorption layer pattern by etching at least a portion of the light absorption layer by using the photoresist pattern as an etch mask,
wherein the wet-processing of the photomask comprises removing the photoresist pattern by using the cleaning composition.

8. A method of cleaning a photomask, the method comprising:
exposing a photoresist layer formed on a wafer to extreme ultraviolet (EUV) light that is reflected by a photomask; and
cleaning the photomask by using a cleaning composition,
wherein the cleaning composition has an acidic pH and comprises a sulfate in an amount of about 75 to about 99 wt %, an oxidizing agent in an amount of about 0.1 to about 1.0 wt %, and deionized water (DIW) in an amount of about 0.1 to about 20 wt %), wherein the sulfate comprises a compound represented by the following formula:

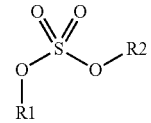

wherein R1 and R2 are each independently a C1-C10 alkyl grow, or a C6-C20 aryl group.

9. The method of claim 8, wherein the pH of the cleaning composition is 5 or less.

10. The method of claim 8, wherein cleaning the photomask comprises subjecting the photomask to the cleaning composition that is maintained at a temperature in a range of about 20 to about 80° C.

* * * * *